US009013002B1

(12) United States Patent
Spry

(10) Patent No.: US 9,013,002 B1
(45) Date of Patent: Apr. 21, 2015

(54) IRIDIUM INTERFACIAL STACK (IrIS)

(75) Inventor: David James Spry, Medina, OH (US)

(73) Assignee: The United States of America as Represented by the Administrator of National Aeronautics and Space Administration, Washington, DC (US)

( * ) Notice: Subject to any disclaimer, the term of this patent is extended or adjusted under 35 U.S.C. 154(b) by 207 days.

(21) Appl. No.: 13/534,745

(22) Filed: Jun. 27, 2012

Related U.S. Application Data

(60) Provisional application No. 61/566,310, filed on Dec. 2, 2011.

(51) Int. Cl.
  H01L 21/70 (2006.01)
  H01L 23/485 (2006.01)
  H01L 21/768 (2006.01)

(52) U.S. Cl.
  CPC ......... *H01L 23/485* (2013.01); *H01L 21/76895* (2013.01)

(58) Field of Classification Search
  None
  See application file for complete search history.

(56) References Cited

U.S. PATENT DOCUMENTS

| | | | |
|---|---|---|---|
| 5,729,054 A * | 3/1998 | Summerfelt et al. | 257/751 |
| 5,811,851 A * | 9/1998 | Nishioka et al. | 257/310 |
| 5,907,470 A * | 5/1999 | Kita et al. | 361/311 |
| 6,171,934 B1 * | 1/2001 | Joshi et al. | 438/469 |
| 6,566,753 B2 | 5/2003 | Zhang et al. | |
| 6,812,126 B1 | 11/2004 | Paranjpe et al. | |
| 6,853,535 B2 | 2/2005 | Fox et al. | |
| 7,015,049 B2 | 3/2006 | Egger et al. | |
| 7,064,437 B2 | 6/2006 | Iwasaki et al. | |
| 7,186,572 B2 | 3/2007 | Wouters et al. | |
| 7,217,970 B2 | 5/2007 | Marsh | |
| 7,358,143 B2 | 4/2008 | Uno et al. | |
| 2003/0036239 A1 * | 2/2003 | Lim et al. | 438/381 |
| 2004/0211998 A1 * | 10/2004 | Araujo et al. | 257/295 |
| 2008/0096381 A1 | 4/2008 | Han et al. | |
| 2009/0325369 A1 | 12/2009 | Kim et al. | |
| 2012/0134195 A1 * | 5/2012 | Sim | 365/72 |

OTHER PUBLICATIONS

Spry, D.J. and Lukco, D; published paper titled "A Bondable Metallization Stack that Prevents Diffusion of Oxygen and Gold into Monolithically Integrated Circuits Operating Above 500 degrees C"; Journal of Electronic Materials ISSN0361-5235; vol. 36, No. 2; Oct. 21, 2011.

* cited by examiner

*Primary Examiner* — David Vu
*Assistant Examiner* — Cuong B Nguyen
(74) *Attorney, Agent, or Firm* — Robert H. Earp, III

(57) ABSTRACT

An iridium interfacial stack ("IrIS") and a method for producing the same are provided. The IrIS may include ordered layers of $TaSi_2$, platinum, iridium, and platinum, and may be placed on top of a titanium layer and a silicon carbide layer. The IrIS may prevent, reduce, or mitigate against diffusion of elements such as oxygen, platinum, and gold through at least some of its layers.

15 Claims, 7 Drawing Sheets

IRIDIUM INTERFACIAL STACK (IRIS)

CROSS REFERENCE TO RELATED APPLICATIONS

This application is a non-provisional of, and claims priority to, U.S. Provisional Patent Application Ser. No. 61/566,310, filed Dec. 2, 2011, the subject matter of which is hereby incorporated by reference in its entirety.

ORIGIN OF THE INVENTION

The invention described herein was made by an employee of the United States Government and may be manufactured and used by or for the Government for Government purposes without the payment of any royalties thereon or therefore.

FIELD

The present invention generally pertains to reducing diffusion in integrated circuits, and more specifically, to using an iridium interfacial stack to reduce, mitigate against, or prevent diffusion of certain elements at high temperatures.

BACKGROUND

Electronics used for applications such as deep oil well drilling, jet engine testing, and Venus exploration should generally be capable of operating effectively at high temperatures. For instance, in order to be effective, such electronics should be able to signal condition, amplify, and transmit sensor information at temperatures that may exceed 500° C. In order to achieve viable high temperature silicon carbide (SiC) electronics, the contacts, dielectrics, die attach, wire bond, and packaging should all be capable of operating at high temperatures. Recently, simple SiC circuits have been demonstrated that operate over a temperature range of −150° C. to over 500° C. and for over 10,000 hours at 500° C. in air ambient.

However, In order to make more complicated integrated circuits using SiC, high temperature interconnect metals and processes are generally required. These processes should work in concert with one another. Previous work has produced ohmic contacts that survived 600° C. in air ambient for over 1,000 hours. However, the 600° C. nitrogen anneal for 30 minutes that is necessary to form the ohmic contact leaves $Pt_2Si$ on the surface, which makes gold wire bonding to the metal stack difficult. A second metallization stack could be deposited to make an easy wire bond, but this adds extra masking and deposition steps. Accordingly, a simpler, faster, and more cost-effective process for making integrated circuits for high temperature operation may be beneficial.

SUMMARY

Certain embodiments of the present invention may be implemented and provide solutions to the problems and needs in the art that have not yet been fully solved by conventional high temperature electronics. For example, certain embodiments of the present invention pertain to an iridium interfacial stack ("IrIS") that prevents or retards diffusion of certain elements into monolithically integrated circuits and silicon carbide (SiC) above certain temperatures.

In one embodiment of the present invention, an apparatus includes an IrIS. The IrIS is configured to prevent, reduce, or mitigate against diffusion of at least one element through at least some layers of the IrIS.

In another embodiment of the present invention, an apparatus includes an IrIS including an iridium layer above a TaSi2 layer. The apparatus also includes a contact. The IrIS is configured to prevent, reduce, or mitigate against diffusion of gold, platinum, oxygen, and silicon through at least some layers of the IrIS.

In yet another embodiment of the present invention, a method includes depositing metals of an IrIS to a silicon carbide substrate. The method also includes annealing the IrIS and the silicon carbide substrate at a predetermined temperature for a predetermined period of time.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Some embodiments of the present invention pertain to an iridium interfacial stack ("IrIS") that acts as a diffusion barrier, and a method of making the same. More specifically, the IrIS is a bondable metal that, in some embodiments, prevents diffusion of certain elements, such as oxygen and gold, into monolithically integrated circuits above 400° C. and SiC integrated circuits above 500° C. Relatively complex high temperature operation integrated circuits (for instance, 100 to 1,000 transistors in some embodiments) may be developed using IrIS, but any number of transistors may be used as a matter of design choice, accounting for functionality and space limitations. High temperature transistors are generally larger than those found in typical silicon electronics, which are generally designed for operation at room temperature to 100° C., making typical systems unsuitable for high temperature applications.

Embodiments of the present invention may be well suited to various practical applications. For instance, some embodiments may be used in electronics that are part of drilling equipment since the temperature generally gets hotter the deeper the rig drills. Conventional technology involves stuffing equipment with dry ice and hoping the temperature remains sufficiently low for operation. Also, embodiments may be used for jet engine electronics such as in the combustion section, coal power plants, high temperature space applications, and any other application where high temperature operation is desired.

The IrIS may include (from bottom to top) layers of $TaSi_2$/Pt/Ir/Pt. In some embodiments, the $TaSi_2$ layer may be 400 nm thick and the two platinum layers and the iridium layer may each be 200 nm thick. In many embodiments, the IrIS metallization is easily bonded for electrical connection to off-chip circuitry and does not require extra anneals or masking steps. The IrIS may be used directly on ohmic contact metals, dielectric insulating layers, or interconnect metal since the IrIS readily adheres to silicon dioxide ($SiO_2$), silicon nitride ($Si_3N_4$), and titanium.

Figure 1:
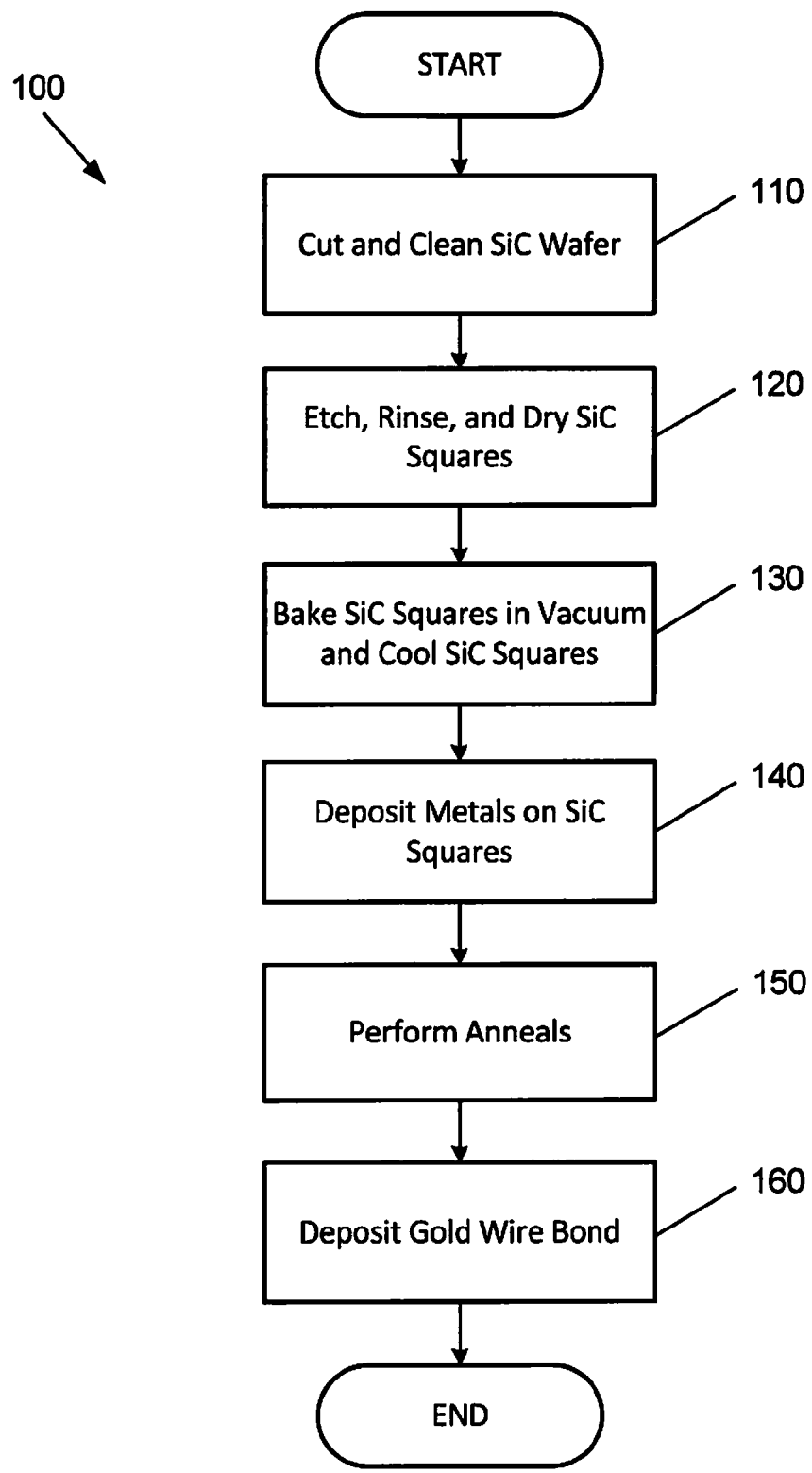
FIG. 1 is a flowchart 100 illustrating a method for creating an SiC integrated circuit with an IrIS metallization stack, according to an embodiment of the present invention.

Example Method for Creating a Silicon Carbide Integrated Circuit with an Iris Metallization Stack FIG. 1 is a flowchart 100 illustrating a method for creating a SiC integrated circuit with an IrIS metallization stack, according to an embodiment of the present invention. The method begins with cutting and cleaning a SiC wafer at 110. The SiC wafer may be any suitable commercially available wafer in some embodiments. For example, the SiC wafer may be a 50 mm diameter 6H n-type SiC wafer cut at 3.91° off the c-axis with resistivity of 0.087Ω per cm. The samples may be cut into any suitable size and shape, such as 1 cm×1 cm squares, but may have any desired shape and/or different shapes with respect to one another. The SiC wafer may be cleaned with any suitable chemical, such as acetone and isopropanol.

The SiC squares are then etched, rinsed, and dried at 120. More specifically, in some embodiments, the SiC squares may be etched in buffered hydrofluoric acid for 5 minutes, rinsed in deionized water, and nitrogen dried. The SiC squares may then be etched in a 1:1 mixture of sulfuric acid:hydrogen peroxide for 15 minutes, rinsed in deionized water, and nitrogen dried.

The SiC squares are then baked in a vacuum and cooled at 130. In many embodiments, the SiC squares are immediately loaded into a vacuum system for metal deposition. The deposition system may be load-locked and may be pumped to a low pressure (e.g., $8 \times 10^{-9}$ Torr) before the run. The samples may be baked in these vacuum conditions at 300° C. for one hour before cooling for one additional hour, for example. However, any suitable temperatures and bake times may be used.

Metals are then deposited at 140. For instance, in some embodiments, Ti/$TaSi_2$/Pt/Ir/Pt layers (in order) are each deposited at respective thicknesses of 100 nm/400 nm/200 nm/200 nm/200 nm without breaking vacuum. All targets may be presputtered for a predetermined time (e.g., 5 minutes) prior to each deposition.

Figure 2:
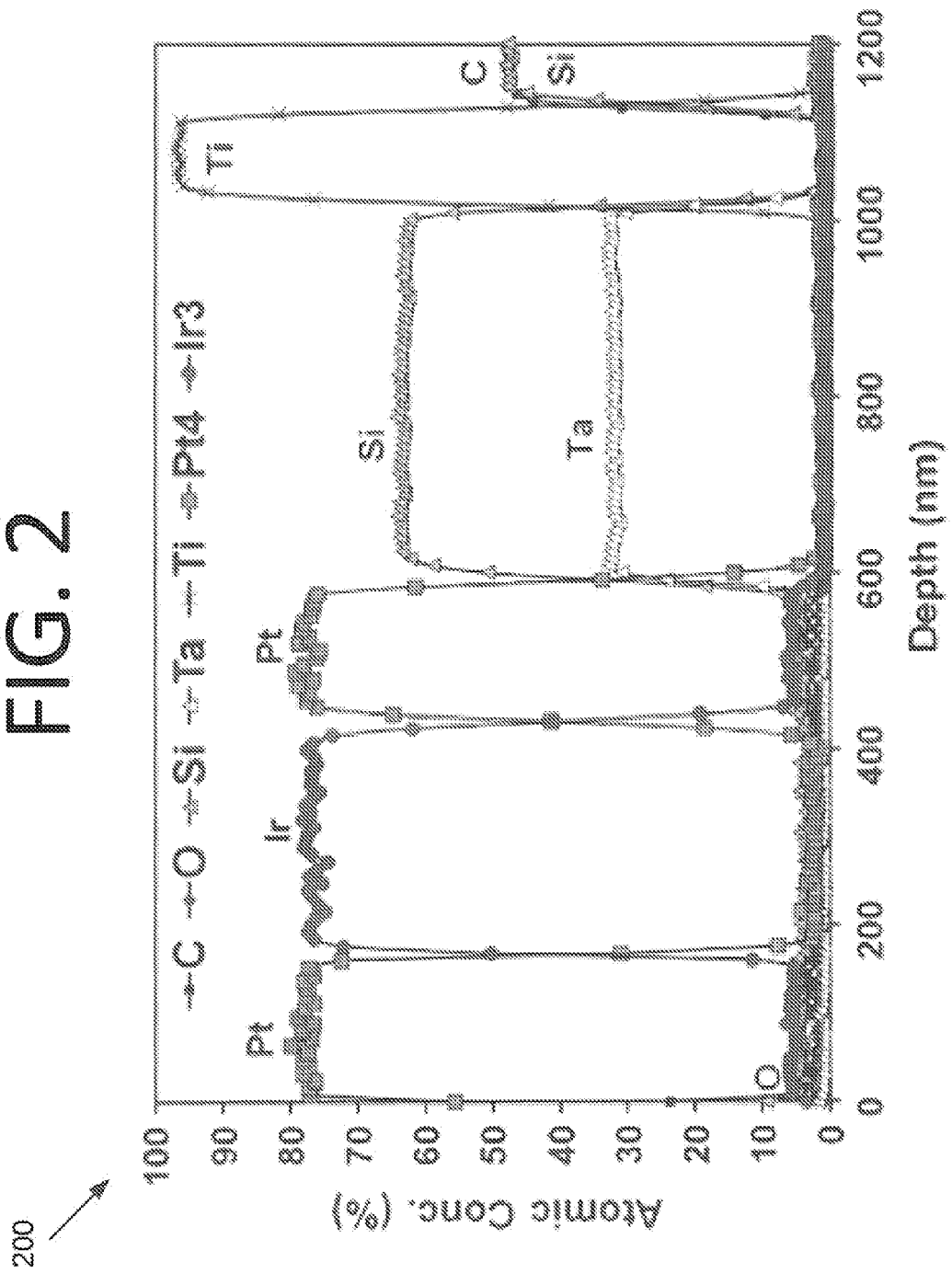
FIG. 2 illustrates an AES depth profile of $Ti/TaSi_2/Pt/Ir/Pt$ as deposited on 6H SiC, according to an embodiment of the present invention.

FIG. 2 illustrates an Auger electron spectroscopy ("AES") depth profile 200 of Ti/$TaSi_2$/Pt/Ir/Pt as deposited on 6H SiC, according to an embodiment of the present invention. Although the titanium, platinum, and iridium are all pure metal layers and should be at 100% in the profiles, the only Auger peaks for platinum and iridium that had no other elemental spectral interference were small high-energy lines with high noise, which contributed signals to all other elements scanned, thereby reducing the intensity of the platinum and iridium.

Returning to FIG. 1, the SiC squares with the deposited metals are then subjected to annealing at 150. Each anneal is performed in a desired gas environment at a predetermined temperature for a predetermined period of time. However, the temperature and/or gas environment may be varied during an anneal, if desired. For example, in some embodiments, an anneal may be performed at one atmosphere in pure $N_2$ in a cleanroom tube furnace at 600° C. for 30 minutes. However, these conditions may be varied as a matter of design choice. Additional thermal processes may also occur during die attach and wire bonding. A gold wire bond is then applied at 160 via an e-beam. The process then ends. Such embodiments can be fabricated in a single processing step, unlike conventional approaches, where multiple processing steps and alignments are required.

Figure 3:
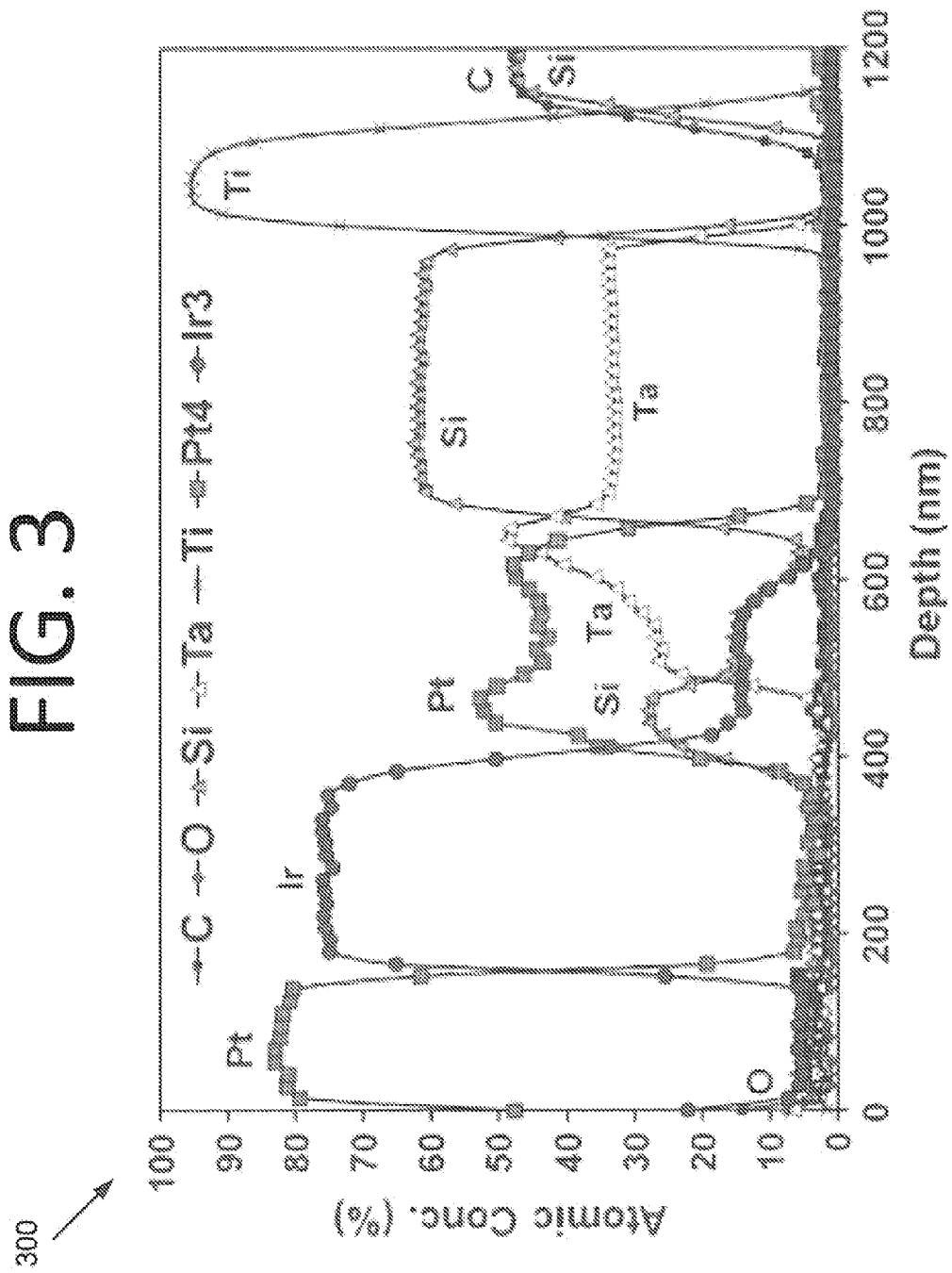
FIG. 3 illustrates an AES depth profile after the metal stack is annealed for 600° C. in $N_2$ for 30 minutes, 500° C. in air for two hours, and 10 minutes at 180° C. on a hot plate, according to an embodiment of the present invention.

FIG. 3 illustrates an AES depth profile 300 after the metal stack is annealed for 600° C. in $N_2$ for 30 minutes, 500° C. in air for two hours, and 10 minutes at 180° C. on a hot plate, according to an embodiment of the present invention. FIG. 3 simulates a bond metal layer in a device after processing and packaging is complete, but before any duration testing at 500° C., for example. This sample was first annealed at 600° C. for 30 minutes in $N_2$, allowing the titanium to react with the SiC and the $TaSi_2$ to form TiC and $Ti_5Si_3$, which form the ohmic contact at the SiC interface.

The platinum layer that is sandwiched between the iridium and $TaSi_2$ layers also reacts during this anneal to form a layer of $Pt_2Si$ near the Ir—Pt interface. This has been found to be very effective as a gold and oxygen diffusion barrier. Interestingly, while there is some migration of iridium into the $Pt_2Si$ layer, there is no evidence for either platinum or silicon in the iridium layer for the samples annealed in air. Since the iridium layer does not readily form a silicide, it prevents the silicon from migrating into the topmost platinum layer during further annealing or high-temperature integrated circuit operation. This leaves a pure platinum layer at the surface, ideal for gold wire bonding.

Figure 4:
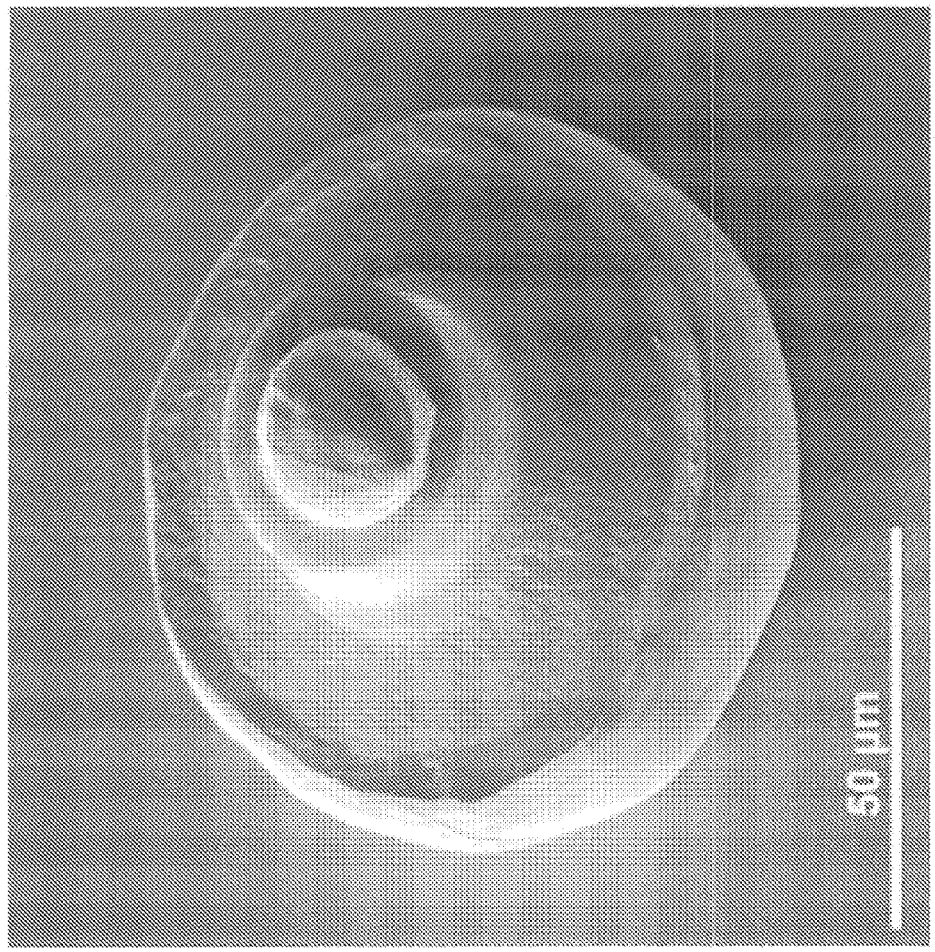
FIG. 4 illustrates a SEM image of a gold wire bond after a pull test, according to an embodiment of the present invention.

This pure platinum surface was used for wire bond testing. Ten gold wire bonds were successfully made to this surface out of ten attempts. All of the wire bonds were then subjugated to a pull test. The gold wires broke from the necking of the wire and not from the wire bond itself. The gold wire used has yield strength of 10 g to 12 g, which means the bond strength is sufficient, and is also greater than that of the wire. A SEM image 400 of one of the gold wire bonds after the pull test is shown in FIG. 4.

Figure 5:
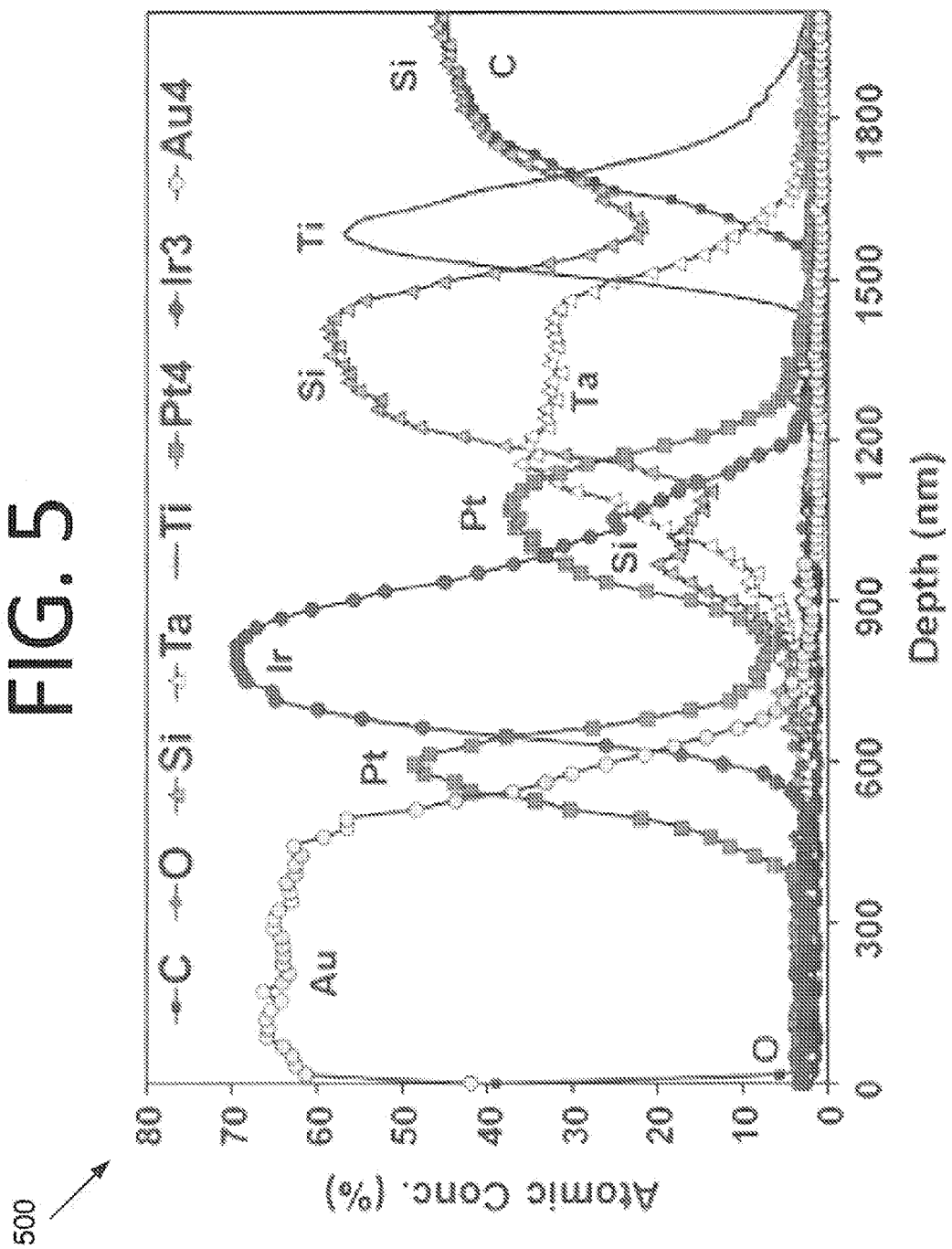
FIG. 5 illustrates an AES depth profile of the metal stack plus 1 μm of gold after 100 hours at 500° C. in air ambient, according to an embodiment of the present invention.

FIG. 5 illustrates an AES depth profile 500 of the metal stack plus 1 μm of gold after 100 hours at 500° C. in air ambient, according to an embodiment of the present invention. The $Pt_2Si$ layer that had formed below the iridium during the 600° C. 30 minute $N_2$ contact anneal is still present with no silicon migration through the iridium layer. However, the topmost platinum is beginning to diffuse into the gold at the Au—Pt interface, as well as partially into the iridium. The metal layers below the iridium layer remain mostly unchanged, except for some broadening of the layers due to a tailing effect in the AES elemental depth profile caused by differing degrees of surface roughness that occur in the gold layer after heating. Both of the AES depth profiles of FIGS. 3 and 5 in air show some mixing of the top platinum and gold, but no platinum at or near the surface. The ohmic contact region at the SiC interface remains pristine and unchanged in all of the samples.

Figure 6:
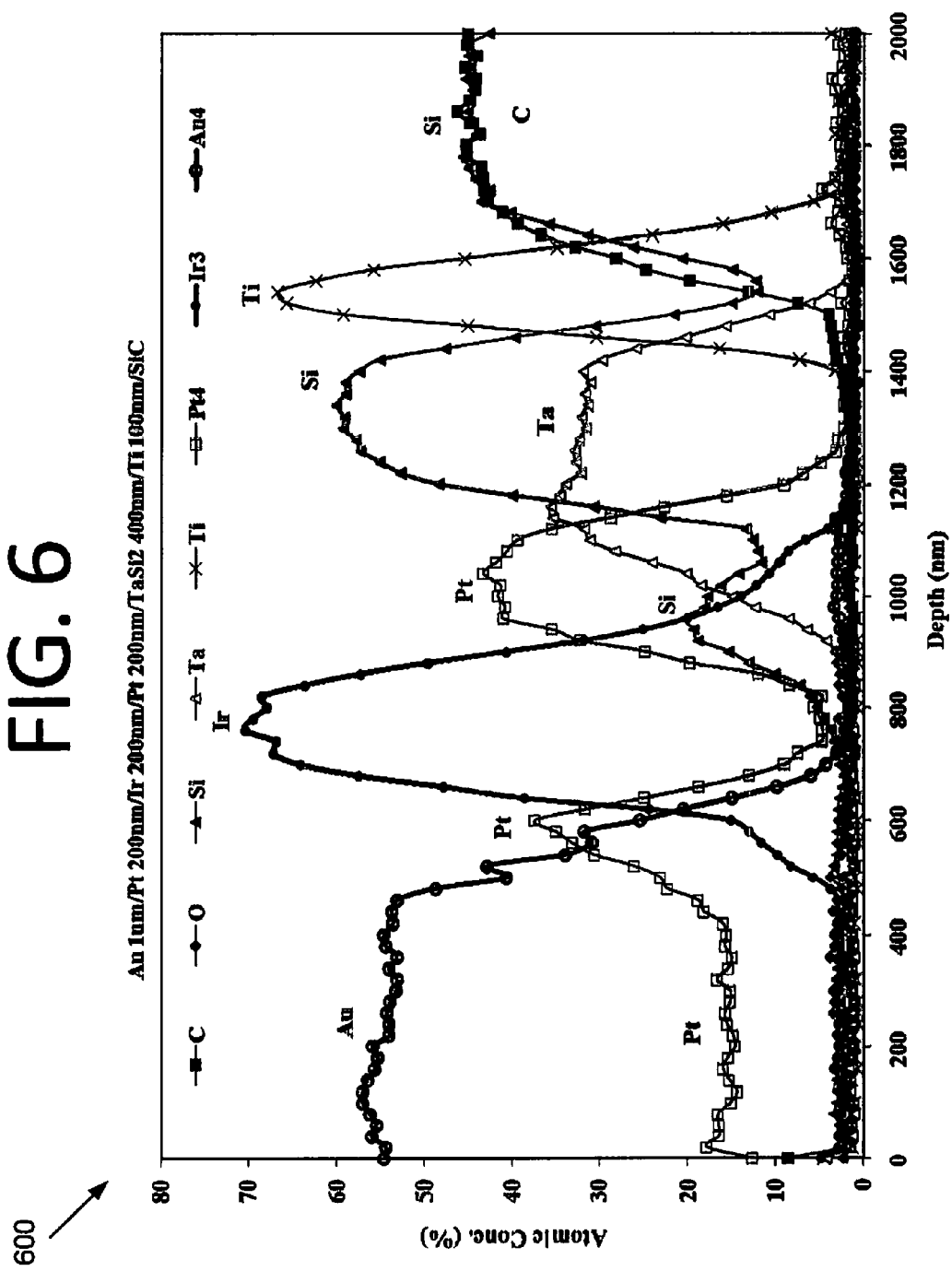
FIG. 6 illustrates an AES depth profile of the metal stack plus 1 μm of gold after 1,000 hours at 500° C. in air ambient, according to an embodiment of the present invention.

FIG. 6 illustrates an AES depth profile 600 of the metal stack plus 1 µm of gold after 1,000 hours at 500° C. in air ambient, according to an embodiment of the present invention. The gold in this sample has nearly completely dissolved the top platinum. However, no gold or oxygen has penetrated the iridium layer. There is about 10% to 15% platinum in the gold layer, extending all the way to the surface.

Figure 7:
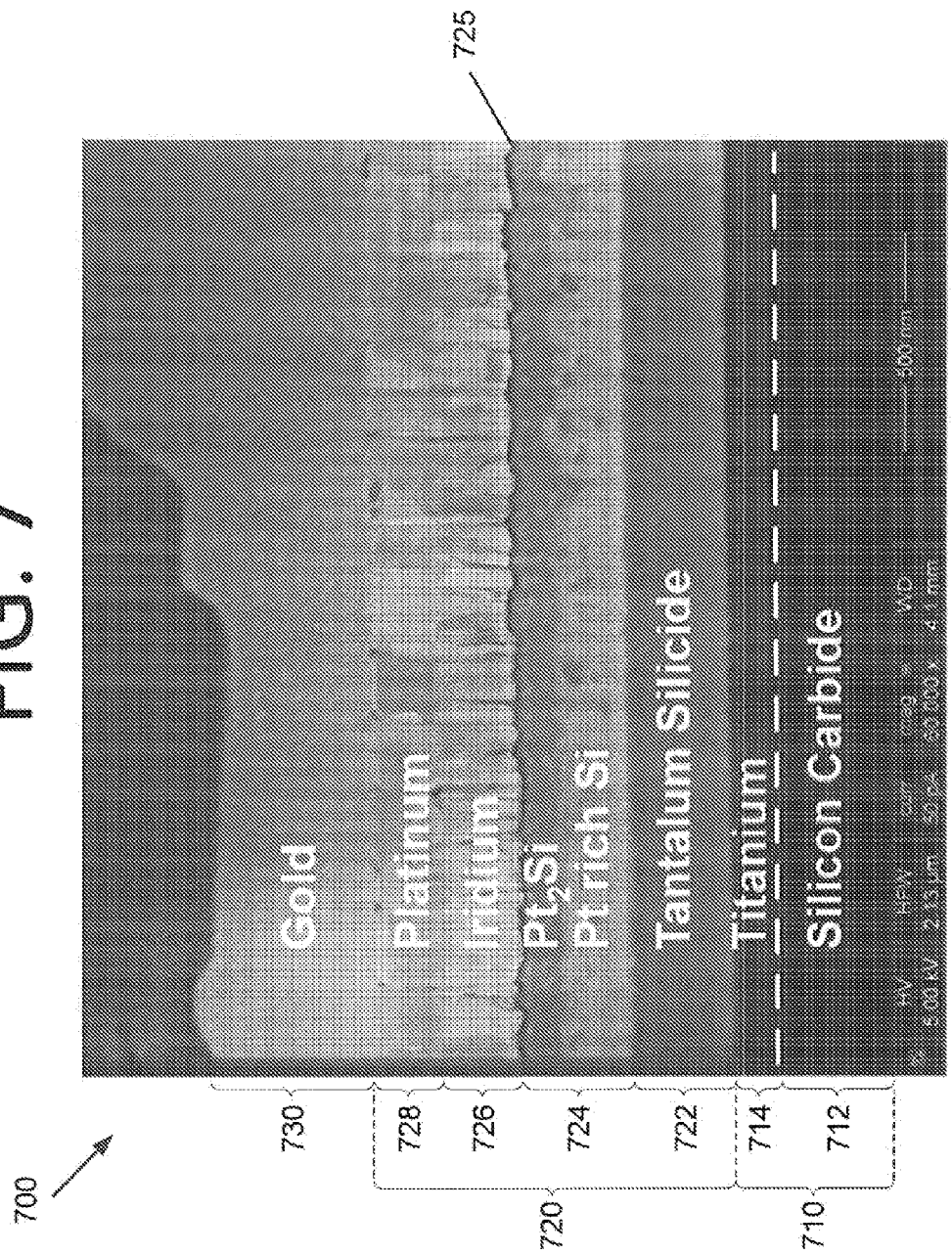
FIG. 7 illustrates a cross-sectional image taken by a FIB-FESEM of an IrIS on a contact, according to an embodiment of the present invention.

FIG. 7 illustrates a cross-sectional image 700 from a focused ion beam field-emission scanning electron microscope ("FIB-FESEM") of an IrIS 720 on a contact 710, according to an embodiment of the present invention. The cross-sectional image is taken after the metal stack plus 1 µm of gold was at 500° C. for 1,000 hours in air ambient, as in FIG. 6. IrIS 720 includes (in deposition order) $TaSi_2$/Pt/Ir/Pt layers 722, 724, 726, 728 with $TaSi_2$ layer 722 resting on top of a contact 710 including a SiC layer 712 and a titanium layer 714.

Per the above, these layers were annealed at 600° C. for 30 minutes in nitrogen ($N_2$) ambient, but air or other suitable gases may be used in some embodiments. The annealing allows $TaSi_2$ layer 722 to react with lower platinum layer 724 to form a $Pt_2Si$ diffusion barrier at the interface between lower platinum layer 724 and iridium layer 726. Iridium layer 726 does not readily form a silicide, and thus keeps upper platinum layer 728 free of silicon. Thus leaves pure platinum on the surface of IrIS 720, making it ideal for gold wire bonding.

1 µm of gold was then e-beamed to mimic a gold wire bond for a 1,000 hour anneal in air, forming gold layer 730. While gold or platinum wire bonds may be preferred, other suitable materials may be used for wire bonds in some embodiments. Such a material should preferably be ductile, soft, a good conductor, and noble (i.e., it doesn't oxidize). Gold has all of these characteristics.

The result of this process, from bottom to top, is a SiC layer 712 under a titanium layer 714 (layer separation indicated by a dashed white line). Above the titanium layer is IrIS 720. IrIS 720 includes a $TaSi_2$ layer 722, a lower platinum layer 724, an iridium layer 726, and an upper platinum layer 728. Lower platinum layer 724 includes a platinum rich silicon layer on the bottom and a $Pt_2Si$ layer on the top. The platinum mixes with both tantalum and silicon. Iridium layer 726 prevents the silicon from migrating between lower platinum layer 724 and upper platinum layer 728. Thus, upper platinum layer 728 remains pure platinum. Gold layer 730 is above IrIS 720, simulating a wire bond.

IrIS 720 prevents diffusion in two ways. First, the $Pt_2Si$ layer within lower platinum layer 724 of IrIS 720 prevents gold from gold layer 730, platinum from upper platinum layer 728, or oxygen from diffusing downward towards SiC layer 712. As can be seen upon careful inspection of iridium layer 726 and gold layer 730 of FIG. 7, iridium and gold have column-like structures when deposited due to nanometer cracks. $Pt_2Si$ acts as a good diffusion barrier by "stuffing" the cracks between the iridium grains. This keeps the ohmic contact interface that transports signals in and out of the semiconductor of the SiC substrate functioning properly and increases the life of the circuit since gold and oxygen reduce circuit life if they get through the cracks.

The dark line 725 on the bottom of iridium later 726 is believed to be extra silicon, which provides an extra layer of protection. If gold, platinum, or oxygen were to reach titanium layer 714, a voltage drain may be caused, changing the resistance, or the circuit may become semi-rectifying like back-to-back diodes. This results in an undesired change in behavior of the ohmic contact, which is no longer stable. The second way diffusion is prevented is via iridium layer 726 of IrIS 720 preventing silicon from diffusing upward to reach gold layer 730.

Some embodiments of the present invention pertain to an IrIS and a method of making the same. In some embodiments, $TaSi_2$/Pt/Ir/Pt acts as a gold and oxygen diffusion barrier, while at the same time leaving pure platinum on the surface for easy gold ball bonding. The metal layers can be deposited in a single deposition run while having the two platinum layers perform very different tasks. This simplifies and expedites fabrication of circuits designed for operation at 500° C. or more in air ambient. Iridium, which does not readily form a silicide at temperatures greater than 600° C., acts as a good silicon diffusion barrier. The platinum underneath the iridium reacts with $TaSi_2$ to from $Pt_2Si$, which acts as a gold and oxygen diffusion barrier.

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. An apparatus, comprising:
an iridium interfacial stack ("IrIS") comprising a $TaSi_2$ layer, a lower platinum layer, an iridium layer, and an upper platinum layer, where the stack is electrically conductive and provides a bondable surface, and
wherein the IrIS is configured to prevent, reduce, or mitigate against diffusion of at least one element through at least some layers of the IrIS.

2. The apparatus of claim 1, wherein the $TaSi_2$ layer has a depth of 400 nm and all other layers of the IrIS have a depth of 200 nm.

3. The apparatus of claim 1, further comprising:
a contact operably positioned under the IrIS.

4. The apparatus of claim 3, wherein the contact comprises a silicon carbide layer and a titanium layer.

5. The apparatus of claim 1, wherein the apparatus is configured to operate for durations of at least 1,000 hours at temperatures of 500° C. or more.

6. The apparatus of claim 5, wherein the apparatus comprises 100 to 1,000 transistors.

7. An apparatus, comprising:
an iridium interfacial stack ("IrIS") comprising a $TaSi_2$ layer, a lower platinum layer, an iridium layer, and an upper platinum layer, where the stack is electrically conductive and provides a bondable surface; and
a semiconductor metal interface contact;
wherein the HS is configured to prevent, reduce, or mitigate against diffusion of gold, platinum, oxygen, and silicon through at least some layers of the IrIS.

8. The apparatus of claim 7, wherein the $TaSi_2$ layer has a depth of 400 nm and all other layers of the IrIS have a depth of 200 nm.

9. The apparatus of claim 7, wherein the contact comprises a silicon carbide layer and a titanium layer.

10. The apparatus of claim 7, wherein the apparatus is configured to operate for durations of at least 1,000 hours at temperatures of 500° C. or more.

11. The apparatus of claim 10, wherein the apparatus comprises 100 to 1,000 transistors.

12. A method, comprising:
depositing metals of an iridium interfacial stack ("IrIS") comprising a $TaSi_2$ layer, a lower platinum layer, an iridium layer, and an upper platinum layer to a silicon carbide substrate; and
annealing the IrIS and the silicon carbide substrate at a predetermined temperature for a predetermined period of time.

13. The method of claim 12, wherein the annealing comprises annealing the IrIS and the silicon carbide substrate in a vacuum.

14. The method of claim 12, further comprising:
depositing a layer of titanium to the silicon carbide substrate prior to depositing the metals of the MS.

15. The method of claim 12, wherein the annealing comprises annealing the IrIS and the silicon carbide substrate in a pure nitrogen ($N_2$) environment.

* * * * *